(12) United States Patent
Matsushita

(10) Patent No.: US 7,915,747 B2
(45) Date of Patent: Mar. 29, 2011

(54) SUBSTRATE FOR FORMING SEMICONDUCTOR LAYER INCLUDING ALIGNMENT MARKS

(75) Inventor: Keiichi Matsushita, Ota-ku (JP)

(73) Assignee: Kabushiki Kaisha Toshiba, Tokyo (JP)

(*) Notice: Subject to any disclaimer, the term of this patent is extended or adjusted under 35 U.S.C. 154(b) by 781 days.

(21) Appl. No.: 11/475,167

(22) Filed: Jun. 27, 2006

(65) Prior Publication Data

US 2006/0292833 A1 Dec. 28, 2006

(30) Foreign Application Priority Data

Jun. 27, 2005 (JP) ................. 2005-187042
Sep. 14, 2005 (JP) ................. 2005-266939

(51) Int. Cl.
*H01L 23/544* (2006.01)

(52) U.S. Cl. .......... 257/797; 257/78; 257/103; 257/431; 257/432; 257/433; 257/434; 257/442; 257/443; 257/446; 257/E23.179; 257/E21.108; 257/E21.131; 438/401; 438/462; 438/478; 250/370.08; 250/370.1; 250/370.12; 250/370.13; 250/370.14

(58) Field of Classification Search .............. 438/478, 438/462, 401; 257/797, 78, 103, 431, 432, 257/433, 434, 443, 442, 446, E23.179, E21.108, E21.131; 250/370.08, 370.1, 370.12, 370.13, 370.14

See application file for complete search history.

(56) References Cited

U.S. PATENT DOCUMENTS

| | | | | |
|---|---|---|---|---|
| 5,727,008 A | * | 3/1998 | Koga ................... | 372/43.01 |
| 5,729,020 A | * | 3/1998 | Matsushita et al. .... | 250/370.08 |
| 6,864,590 B2 | * | 3/2005 | Bae et al. ............. | 257/797 |
| 2005/0202682 A1 | * | 9/2005 | Kiyoku et al. ........ | 438/762 |
| 2006/0102924 A1 | * | 5/2006 | Otani et al. .......... | 257/103 |

FOREIGN PATENT DOCUMENTS

| | | |
|---|---|---|
| JP | 11-40849 | 2/1999 |
| JP | 2002-305149 | 10/2002 |
| JP | 2003-113000 | 4/2003 |

* cited by examiner

*Primary Examiner* — Fernando L Toledo
*Assistant Examiner* — John P Dulka
(74) *Attorney, Agent, or Firm* — Oblon, Spivak, McClelland, Maier & Neustadt, L.L.P.

(57) ABSTRACT

A substrate for forming a semiconductor layer includes a plurality of linear convexes or grooves on a surface of the substrate by crystal growth. The plurality of linear convexes or grooves are formed along a direction of a cleavage plane of the semiconductor layer.

10 Claims, 7 Drawing Sheets

SUBSTRATE FOR FORMING SEMICONDUCTOR LAYER INCLUDING ALIGNMENT MARKS

CROSS-REFERENCE TO RELATED APPICATIONS

This application is based upon and claims the benefit of priority from the prior Japanese Patent Applications No. 2005-187042 filed on Jun. 27, 2005 and No. 2005-266939 filed on Sep. 14, 2005, the entire contents of which are incorporated herein by reference.

BACKGROUND OF THE INVENTION

1. Field of the Invention

The present invention relates to a substrate for crystal growth forming semiconductor layer, a semiconductor device such as, for example, but not limited to, a power device and an optical device, and a manufacturing method of a semiconductor device, and more particularly to the substrate, the semiconductor device, and the manufacturing method for forming a III-V group compound semiconductor layer on the surface of the substrate and for example, manufacturing a high-output high frequency transistor.

2. Description of the Related Art

As a material of a high-output power device operating at high frequency band, various III-V group compound semiconductors are used. Among them, in recent years, nitride semiconductors such as gallium nitride (GaN) and aluminum gallium nitride (AlGaN) having high break down voltage and capable of operating at a high voltage are used as a material for high-output frequency devices.

Such a nitride semiconductor is grown on the substrate or a semiconductor layer or an insulating layer formed on the substrate by epitaxial growth using the MOCVD (metal-organic chemical vapor deposition) method or MVD (molecular vapor deposition) method. In order to realize growth of a stable semiconductor crystal, it is desirable that the growth layer and substrate have the same lattice constant and coefficient of thermal expansion. However, it is actually difficult to obtain such a substrate, so that for the substrate as a sapphire substrate and a SiC substrate which are comparatively inexpensive, have a larger size wafer, and are different in the lattice constant and coefficient of thermal expansion are often used.

However, when a nitride semiconductor layer such as GaN or AlGaN is grown on a sapphire substrate, the substances have large mismatch and coefficient of thermal expansion. Therefore, due to the thermal strain between the substrate and the semiconductor layer formed on the substrate, the substrate may be warped and irregular cracks may be occurred in the semiconductor layer.

For example, a field effect power device for amplifying high frequency power is fabricated using such a substrate. A plurality of elements are formed on the substrate, through a plurality of processes such as a deposition of semiconductor layers and insulating layers and a process for photolithography.

During these processes, when fixing the substrate to the base using such as a vacuum chuck method, it is difficult to hold the substrate flat due to the aforementioned warp of the substrate. For example, at the process for deposition, the temperature distribution of the substrate becomes non-uniform, at the process for photolithography, uniform exposure is difficult. Therefore, in order to obtain a good yield, through all the manufacturing processes, it is required to suppress, as much as possible, an occurrence of deformation such as a warp without applying stress to the substrate.

To suppress an occurrence of such a warp or irregular cracks of the sapphire substrate, for example, in Japanese Patent Publication 2003-113000, an art as indicated on Page 4 and in FIG. 1 for providing a stress offset layer on the back side of a substrate and giving beforehand tensile stress to the substrate is disclosed.

However, by this method, stress is applied to the substrate to suppress the warp. Therefore, through all the processes for manufacturing the power device, it is difficult to continue good suppress of the warp of the substrate. Further, when a crack is caused once to the formed semiconductor layer, the crack is distributed irregularly in the semiconductor layer. Therefore, a problem arises that the reliability and yield of a plurality of power devices formed from this substrate are lowered unexpectedly.

Further, for example, in Japanese Patent Publication H11-40849, a method for installing a destruction induction section composed of a notch groove on the bottom of the sapphire substrate and forming a mask layer at the position on the top of the sapphire substrate corresponding to the destruction induction section is disclosed in the item of and FIG. 1 therein.

However, according to this method, there is a fear that a problem may be caused to the processes. Generally, the thickness of a GaN layer formed on the sapphire substrate is several μm or so, though the sapphire substrate is very thick such as several hundreds μm, that is, several hundreds time of it. Therefore, forming itself of a cracked face extending from the bottom to the top on the very thick sapphire substrate is expected to be greatly hard.

SUMMARY OF THE INVENTION

A substrate for forming semiconductor layers according to an embodiment of the present invention includes a plurality of linear convexes or grooves on a surface of the substrate by crystal growth, the plurality of linear convexes or grooves are formed along a direction of a cleavage plane of the semiconductor layer.

Further, a power device according to an embodiment of the present invention includes a semiconductor substrate having linear convexes or grooves on a surface of the semiconductor substrate having linear convexes or grooves formed along a direction of a cleavage plane of the semiconductor layer.

Further, a power device according to an embodiment of the present invention includes a semiconductor substrate having a plurality of linear convexes or grooves on a surface of the semiconductor substrate, a semiconductor layer formed on the surface; and electrodes formed on the semiconductor layer so as to be arranged above the linear convexes or grooves, the linear convexes or grooves are formed in a direction of a cleavage plane of the semiconductor layer.

Further, an optical device according to an embodiment of the present invention includes a semiconductor substrate having linear convexes or grooves on a surface, a semiconductor layer formed on the surface and including an active layer, an electrode configured to inject a carrier into the active layer, the semiconductor layer is cleaved on the linear convexes or grooves.

Further, a manufacturing method of a semiconductor device according to an embodiment of the present invention, begins by forming linear convexes or grooves on a surface of a semiconductor substrate and forming a semiconductor layer having a cleavage plane along a direction of the linear convexes or grooves by epitaxial growth on the surface.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE EMBODIMENTS

Hereinafter, the embodiments relating to the present invention will be explained with reference to the accompanying drawings. The following embodiments will be explained by taking a field effect power device as an example of power device or a semiconductor device.

First Embodiment

Figure 1:
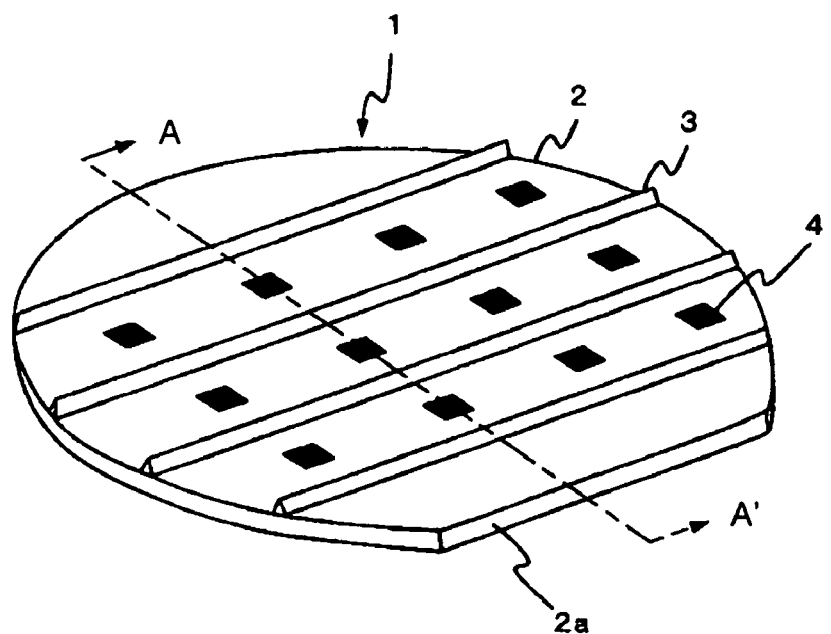
FIG. 1 is a perspective view showing the substrate for forming semiconductor layers of the first embodiment relating to an embodiment of the present invention.
Figure 2:
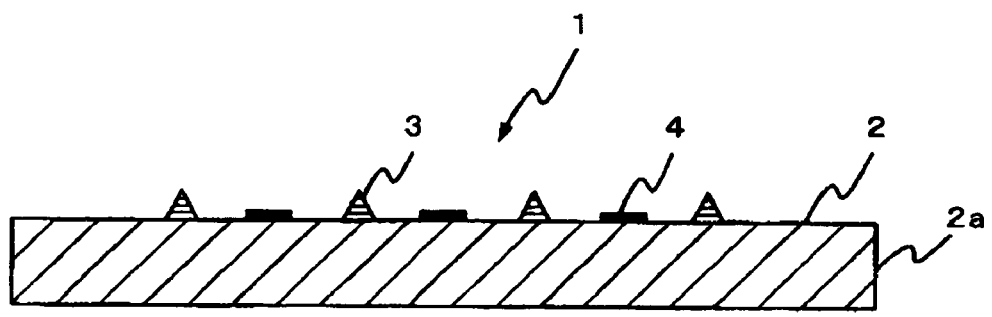
FIG. 2 is a cross sectional view of the section A-A' shown in FIG. 1.

FIG. 1 shows a perspective view of the substrate for forming semiconductor layers of the first embodiment. FIG. 2 is a cross sectional view of the section A-A' of the perspective view shown in FIG. 1. This embodiment shows a case wherein the semiconductor substrate is a sapphire substrate, and on the sapphire substrate, a plurality of linear convexes and position alignment marks for exposure equipment are provided, and furthermore, as a semiconductor layer, a GaN layer which is a nitride semiconductor is formed.

As shown in FIG. 1, on a substrate for forming semiconductor layers 1, on a sapphire substrate 2 with a thickness of several hundreds μm, a plurality of linear convexes 3 are formed at predetermined intervals. The intervals are preferably related to the kind and structure of a field effect power device which will be formed at the subsequent step. For example, in a field effect transistor for amplifying high power, the intervals are 3 to 5 mm. Further, between the linear convexes, a plurality of position alignment marks 4 are provided.

Each of the linear convexes 3, as shown in FIG. 2, is formed so as to have a sectional shape of a triangle. Such a shape, for example, by the CVD (Chemical Vapor Deposition) method, can be formed comparatively easily by depositing silicon oxide and patterning it by the well-known method. The triangle of the section has, for example, a base of 10 μm and a height of 1 μm. Further, the forming direction thereof, in this embodiment, is the direction of [0100] of the sapphire substrate 2 along the plane of cleavage of the GaN layer which will be formed on the sapphire substrate.

Figure 3:
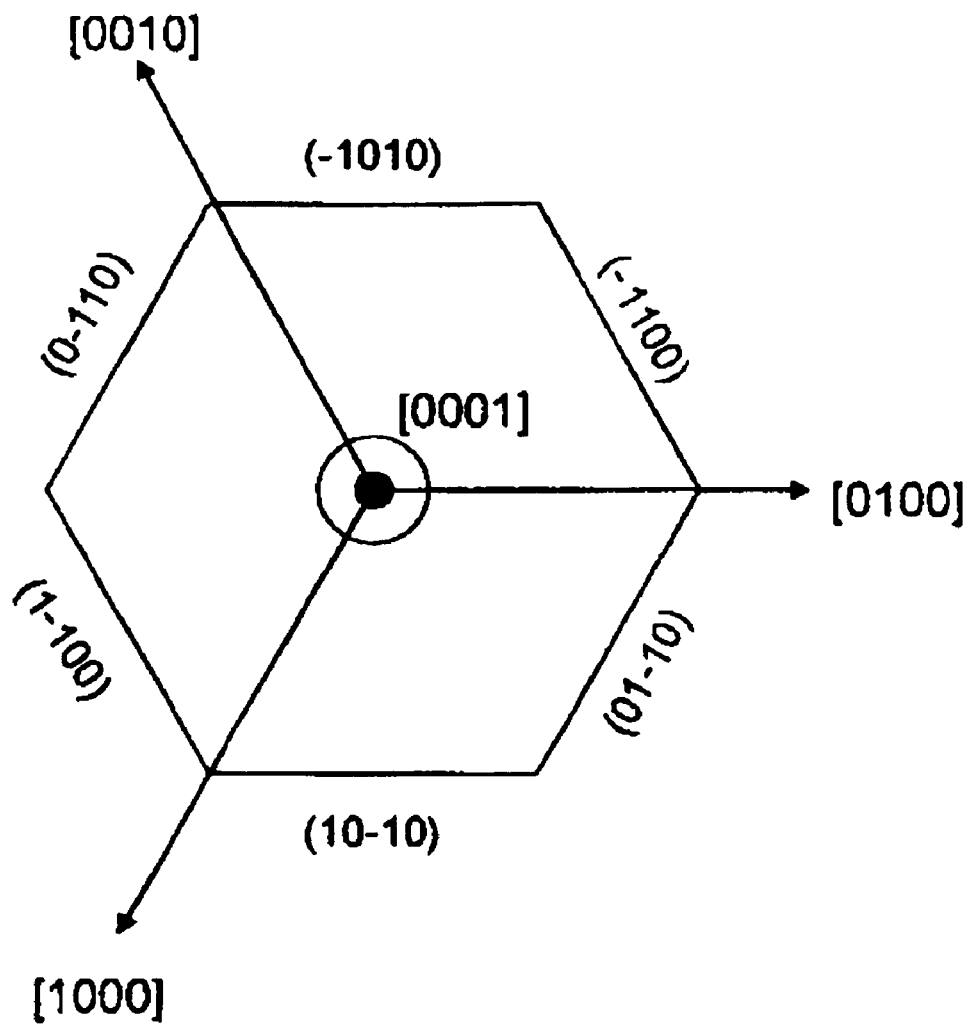
FIG. 3 is a drawing showing the directions of the planes of cleavage of gallium nitride.

FIG. 3 shows the directions of the planes of cleavage of gallium nitride. As shown in the drawing, the deposited GaN has planes of cleavage in the planes (10-10), (1-100), and (01-10) or (-1010), (-1100) and (0-110) which are equivalent to them. Therefore, in the direction of [0100] of the sapphire substrate 2 which is the direction along the plane (10-10) which is one of these planes of cleavage, the linear convexes 3 are formed. Further, when the sapphire substrate 2 has an orientation flat surface 2a in the direction [0100], the direction of forming the linear convexes 3 coincides with the direction of the orientation flat surface 2a.

The position alignment marks 4 are formed, for example, by anisotropic etching such as ICP (inductively coupled plasma) etching. The position alignment marks 4, for example, are used when positioning the exposure equipment at the processes for manufacturing of the field-effect power device formed using the substrate for forming semiconductor layers 1.

The case that the GaN layer is formed as a semiconductor layer on such a substrate for grown crystal layers 1 will be explained below.

Figure 4:
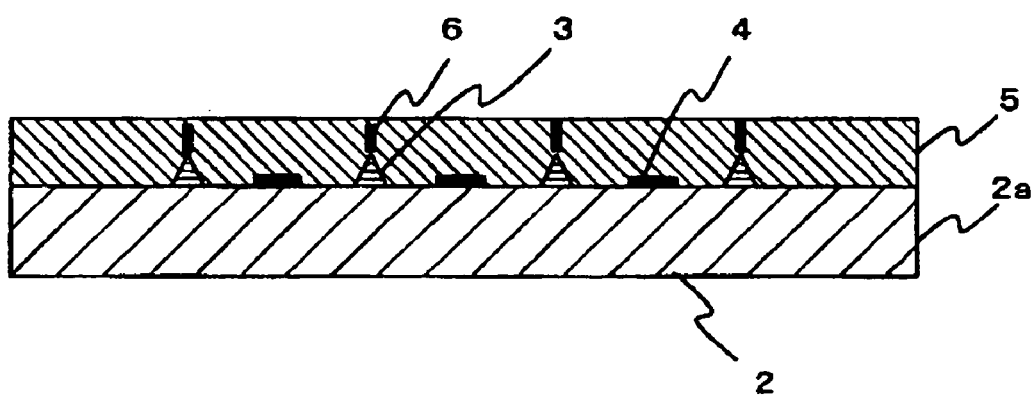
FIG. 4 is a cross sectional view showing a semiconductor layer formed on the substrate shown in FIG. 1.

FIG. 4 shows the GaN layer formed on the substrate for forming semiconductor layers 1 shown in FIG. 1. As shown in the drawing, on the sapphire substrate 2 including the plurality of linear convexes 3, a GaN layer 5 is grown epitaxially and thickness of 3 to 5 μm, for example, by the MOCVD method.

The formed GaN layer 5 generates stress, which is a factor for the warp of the overall substrate, in the layer due to the difference in the lattice constant and the difference in the coefficient of thermal expansion from the sapphire substrate 2. The stress is concentrated on the parts of the upper layer where the linear convexes 3 are formed. Further, the linear convexes 3 are formed in the direction of the plane of cleavage of the GaN layer, so that due to the concerned stress, on the GaN layer 5 where the linear convexes 3 are formed, cracks 6 are generated due to cleavage. And, by the cracks 6, the stress of the GaN layer between the plurality of linear convexes 3 are moderated and the warp of the sapphire substrate 2 is suppressed.

As mentioned above, in this embodiment, on the sapphire substrate 2, the plurality of linear convexes 3 are formed in the direction of the plane of cleavage of the GaN layer will be formed, and when the GaN layer 5 is formed, the stress generated in the layer is concentrated on the parts of the upper layer of the linear convexes 3, so that the cracks 6 are generated positively, and the warp of the sapphire substrate 2 is suppressed, and the stress in the GaN layer can be moderated greatly.

Further, the generation parts of the cracks 6 are concentrated on the circumferences of the linear convexes 3, so that an occurrence of irregular cracks in the other parts is prevented. Therefore, no cracks are included internally and high reliability can be obtained in a power device of a multi-layer structure using the substrate for forming semiconductor layers 1.

Further, as described above, the cracks 6 are formed only inside the GaN layer 5, so that impurities adversely affecting a power device can be suppressed from entering through the cracks.

Furthermore, the position alignment marks 4 are provided between the plurality of linear convexes 3 on the sapphire substrate 2, so that when forming power devices of a multi-layer structure using the substrate for forming semiconductor layers 1, the active areas of those power devices can be formed correctly free of displacement in good area including no cracks of the semiconductor layers. Therefore, power devices of high reliability can be obtained efficiently.

Further, in this embodiment, the sectional shape of the linear convexes is a triangle, though the present invention is not limited to it. Various shapes such as a quadrilateral, a polygon more than it, a semicircle, and a semiellipse can be selected. For these shapes, the similar effect can be produced.

Second Embodiment

Figure 5:
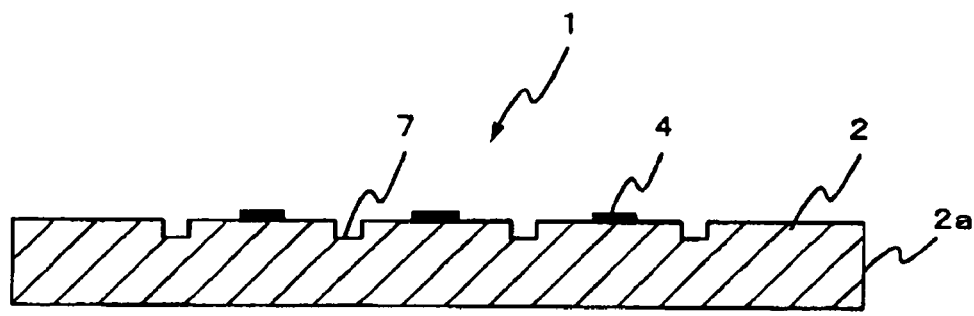
FIG. 5 is a cross sectional view showing the substrate for forming semiconductor layers of the second embodiment relating to an embodiment of the present invention.

FIG. 5 shows a cross sectional view of the substrate for forming semiconductor layers of the second embodiment. Further, in this embodiment, with respect to the units shown in the drawings, to the same parts as the units of the first embodiment, the same numerals are assigned and the explanation thereof will be omitted. This embodiment is different from the first embodiment that linear grooves are provided.

As shown in FIG. 5, on the substrate for forming semiconductor layers 1 of the second embodiment, on the sapphire substrate 2, a plurality of linear grooves 7 are formed at predetermined intervals. These grooves, for example, are formed by the ICP etching as a quadrilateral having a sectional shape of a width of 10 μm and a depth of about 10 μm. The forming direction thereof is the direction along the plane of cleavage of the formed GaN layer. Further, between the linear grooves 7, the plurality of position alignment marks 4 are provided.

Figure 6:
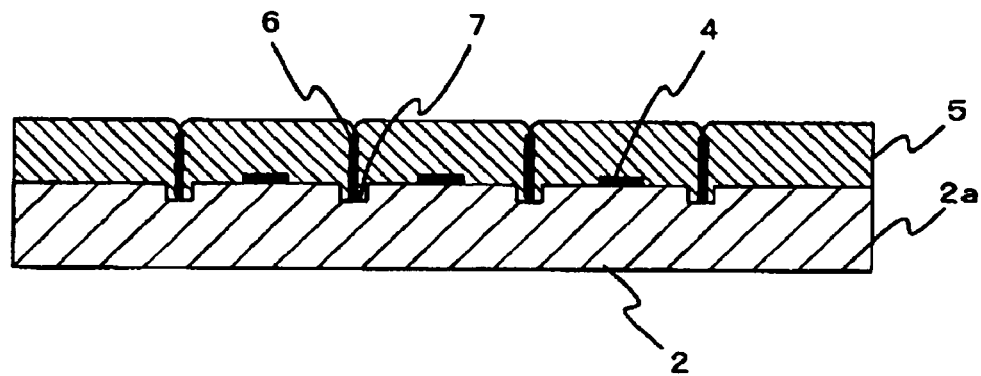
FIG. 6 is a cross sectional view showing a semiconductor layer formed on the substrate shown in FIG. 5.

FIG. 6 shows the GaN layer aforementioned on the substrate for forming semiconductor layers 1 formed. As shown in the drawing, the stress generated in the GaN layer 5 is concentrated on the part of the upper layer where the linear grooves 7 are formed, so that, the cracks 6 due to cleavage are generated on the GaN layer 5 in the circumference where the linear grooves 7 are formed. And, the stress in the GaN layer is moderated by the cracks and the sapphire substrate 2 is prevented from warping.

As mentioned above, in this embodiment, similarly to Embodiment 1, the generation parts of the cracks 6 are concentrated on the parts of the upper layer of the linear grooves 7, so that an occurrence of irregular cracks at the other parts is suppressed. By doing this, no cracks are included internally and high reliability can be obtained in a power device of a multi-layer structure formed using the substrate for forming semiconductor layers 1.

Further, as described above, the cracks 6 are formed only inside the GaN layer 5, so that impurities adversely affecting a power device can be suppressed from entering through the cracks.

Furthermore, the position alignment marks 4 are provided between the plurality of linear grooves 7 on the sapphire substrate 2, so that when forming power devices of a multi-layer structure using the substrate for forming semiconductor layers 1, the active areas of those power devices can be formed correctly free of displacement in good area including no cracks of the semiconductor layers. Therefore, power devices of high reliability can be obtained efficiently.

Further, when using linear grooves as in this embodiment, the groove forming step and the etching step of position alignment marks can be executed at the same time, so that the substrate for forming semiconductor layers can be manufactured efficiently.

Further, in the explanation of the two embodiments aforementioned, a nitride semiconductor formed as a semiconductor layer is composed of GaN, though the present invention is not limited to it. For example, other nitride semiconductors such as AlGaN can be used and the similar effect can be obtained.

Third Embodiment

Figure 7:
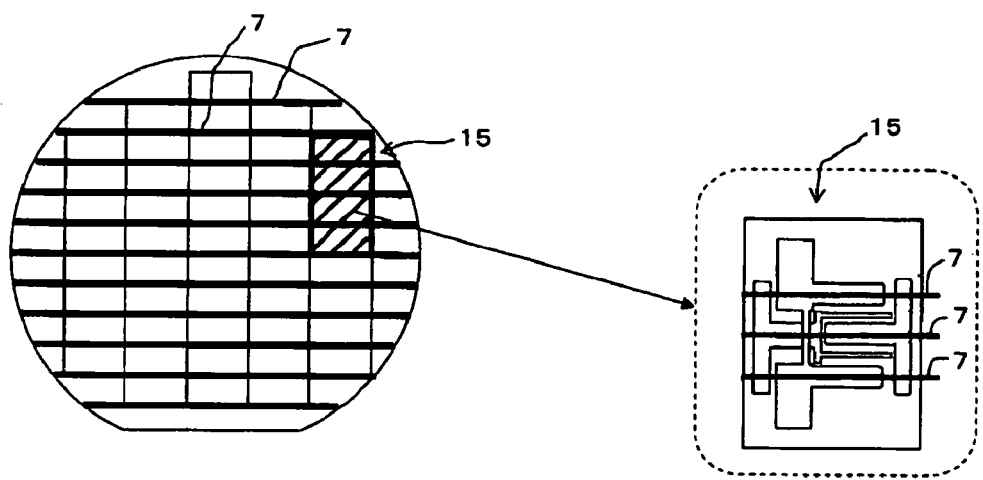
FIG. 7 is a partial squint top view of the power device of the third embodiment relating to an embodiment of the present invention.

FIG. 7 shows a partial squint top view of the power device of the third embodiment. As shown in FIG. 7, linear grooves 7 are formed on the substrate for forming semiconductor layers 1 and furthermore on the upper layer thereof, similarly to the second embodiment, a GaN layer (not drawn) is formed. An active area is formed on the GaN layer and for example, a field effect power device 15 for amplifying power is formed.

Figure 8:
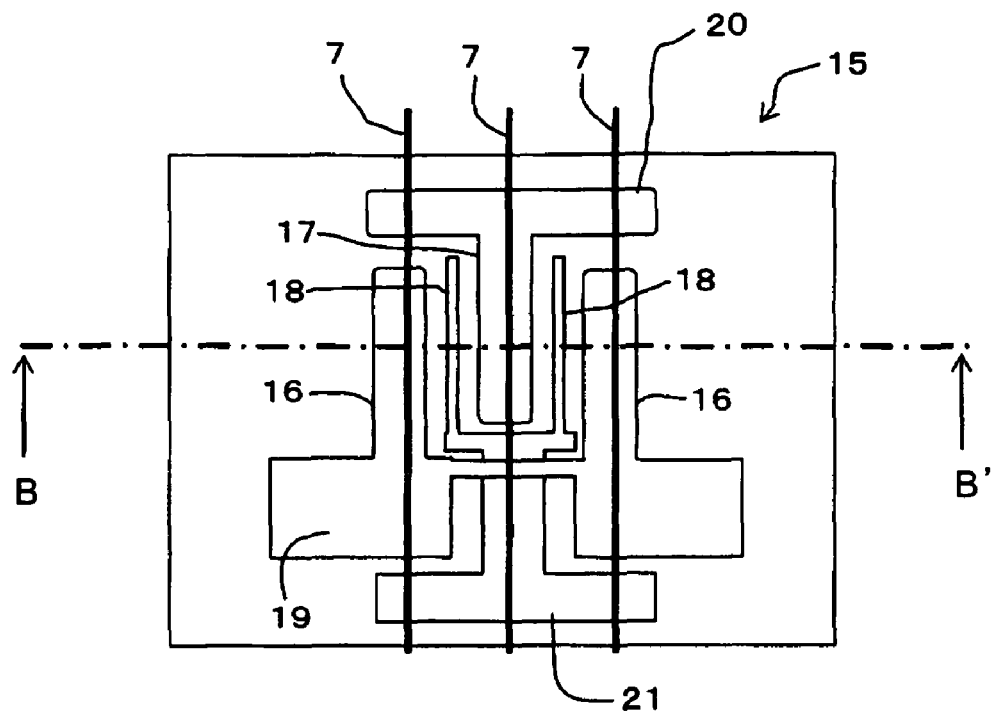
FIG. 8 is an enlarged view of the essential section shown in FIG. 7.
Figure 9:
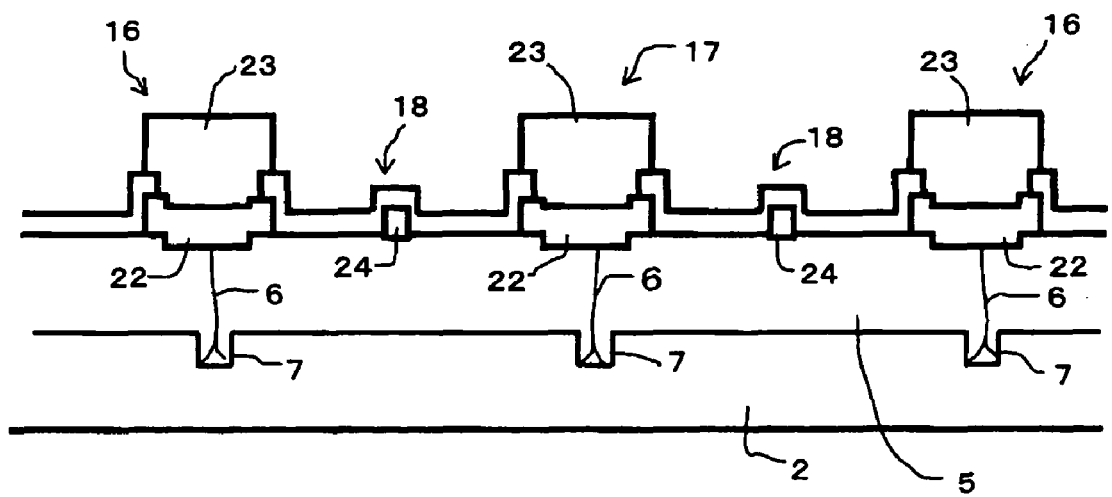
FIG. 9 is a cross sectional view of the section B-B' shown in FIG. 8.

FIG. 8 is an enlarged view of the field effect power device 15 shown in FIG. 7 and FIG. 9 is a cross sectional view of the section B-B' shown in FIG. 8. As shown in FIG. 8, in the field effect power device 15, between a source electrode 16 and a drain electrode 17, a Schottky junction gate electrode 18 is formed. And, the respective electrodes are connected to a source electrode withdrawal section 19, a drain electrode withdrawal section 20, and a gate electrode withdrawal section 21.

And, as shown in FIG. 9, the GaN layer (i-AlGaN or i-GaN) 5 is formed on the sapphire substrate 2 where the linear grooves 7 are formed and the source electrodes 16 and drain electrodes 17 are composed of a titanium-aluminum alloy layer 22 and a gold electrode 23 formed on the upper part thereof. The gate electrodes 18 are composed of a nickel-gold alloy layer 24 forming Schottky junction.

Figure 10:
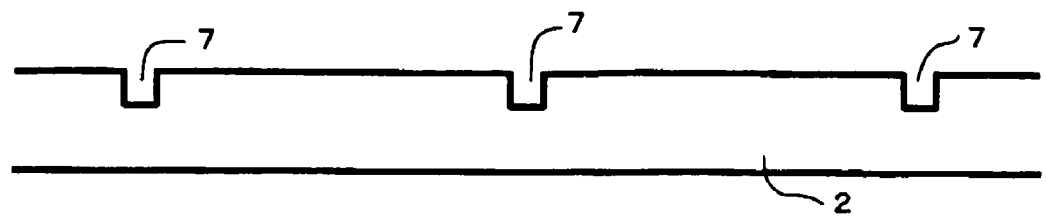
FIG. 10 is a drawing showing the manufacturing steps of the power device of the third embodiment relating to an embodiment of the present invention.
Figure 11:
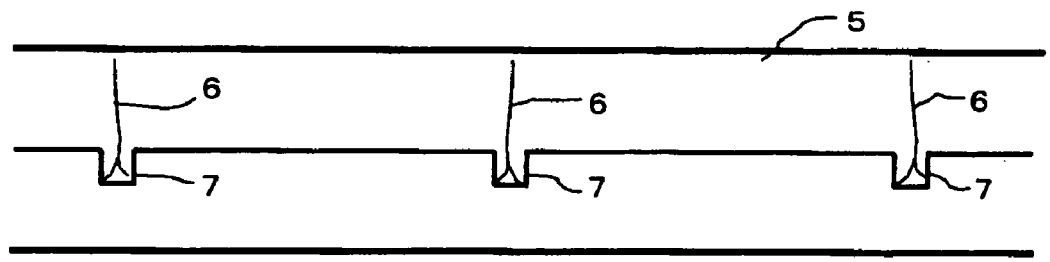
FIG. 11 is a drawing showing the manufacturing steps of the power device of the third embodiment relating to an embodiment of the present invention.

The processes for manufacturing of such a field effect power device are shown in FIGS. 10 to 16. Firstly, as shown in FIG. 10, for example, on the surface of the sapphire substrate 2 with a thickness of 100 to 300 μm, a plurality of parallel linear grooves 7 and position alignment marks (not drawn) are formed. And, as shown in FIG. 11, on the sapphire substrate 2, the GaN layer 5 with a thickness of 3 to 4 μm (i-AlGaN or i-GaN) grows in the vapor phase. A high-temperature heating treatment is performed at this process, so that the cracks 6 are formed upward from each of the linear grooves 7.

Figure 12:
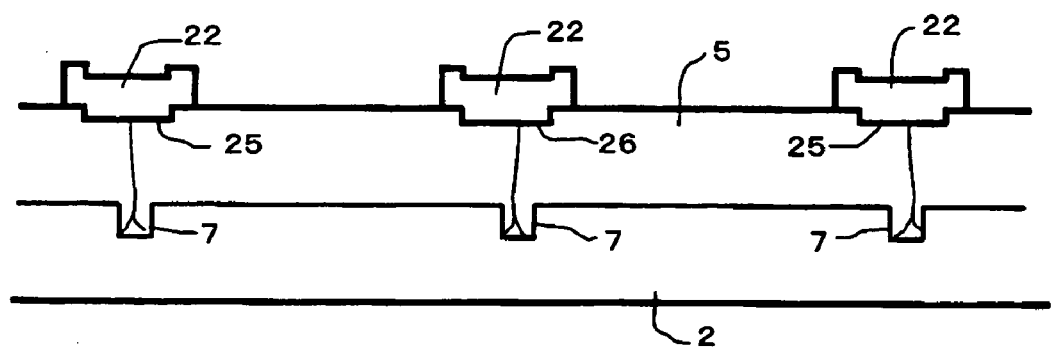
FIG. 12 is a drawing showing the manufacturing steps of the power device of the third embodiment relating to an embodiment of the present invention.

Next, as shown in FIG. 12, on the surface of the GaN layer 5 above the linear grooves 7, recesses which are source electrode concavities 25 and drain electrode concavities 26 are formed. And, the titanium-aluminum alloy layers 22 composing the source electrodes and drain electrodes are formed in these concavities 25 and 26.

Figure 13:
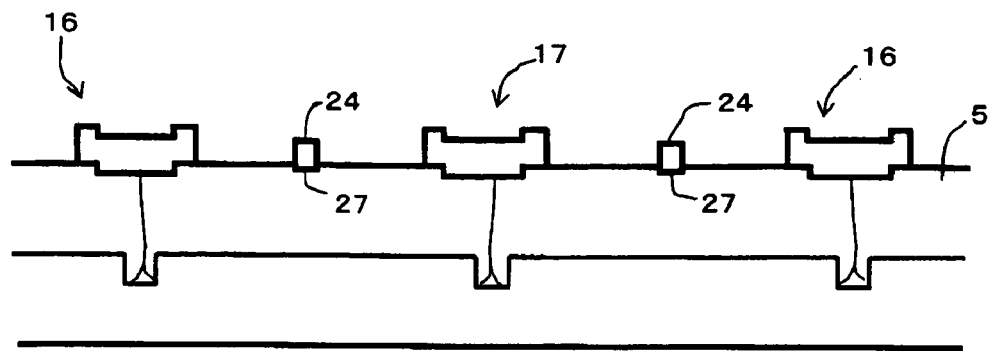
FIG. 13 is a drawing showing the manufacturing steps of the power device of the third embodiment relating to an embodiment of the present invention.
Figure 14:
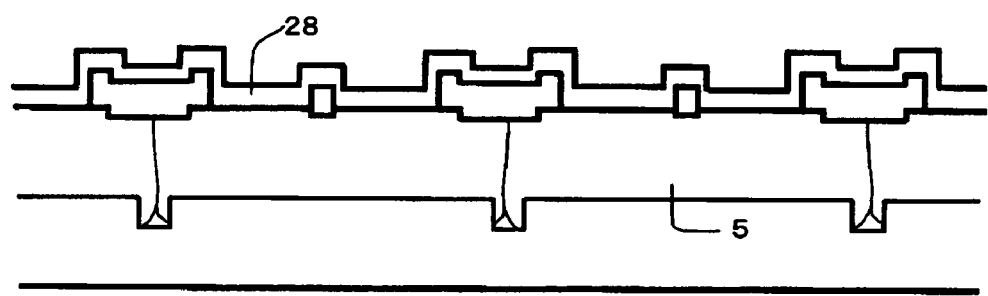
FIG. 14 is a drawing showing the manufacturing steps of the power device of the third embodiment relating to an embodiment of the present invention.

And as shown in FIG. 13, on the surface of the GaN layer 5 and at the centers between the source electrodes 16 and the drain electrodes 17, gate electrode concavities 27 are formed and inside the concavities 27, the nickel-gold alloy layers 24 forming Schottky junction are formed. Furthermore, as shown in FIG. 14, on the top of the GaN layer 5, for example, an insulating layer 28 composed of silicon nitride is formed.

Figure 15:
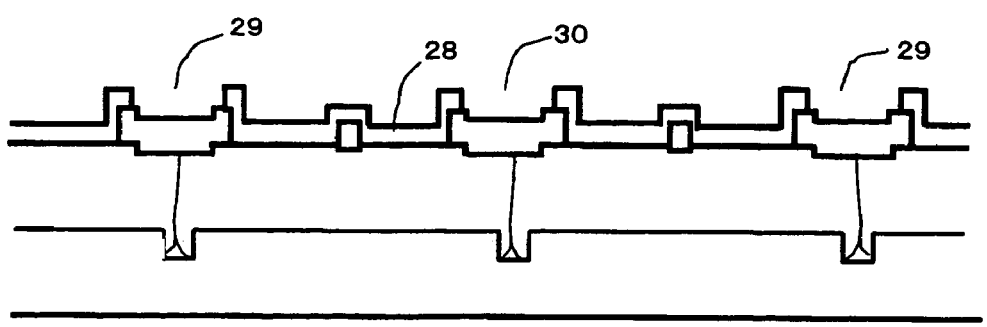
FIG. 15 is a drawing showing the manufacturing steps of the power device of the third embodiment relating to an embodiment of the present invention.
Figure 16:
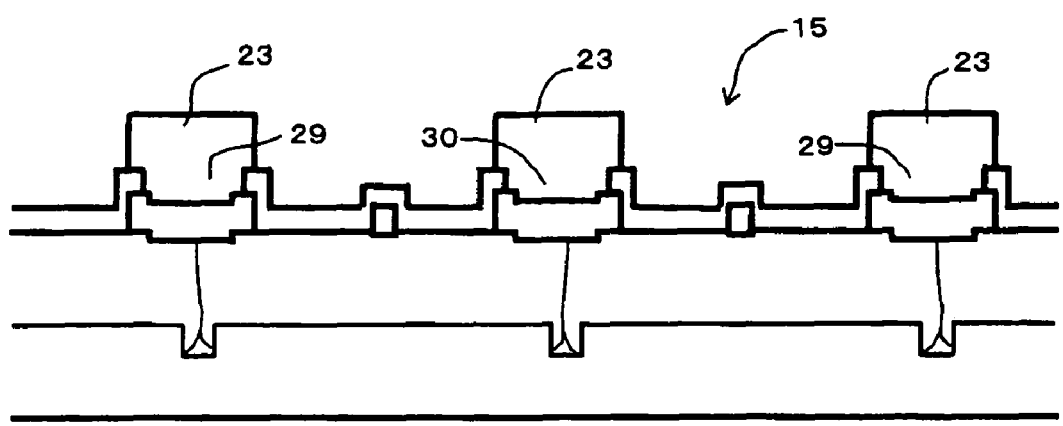
FIG. 16 is a drawing showing the manufacturing steps of the power device of the third embodiment relating to an embodiment of the present invention.

Next, as shown in FIG. 15, source electrode openings 29 and drain electrode openings 30 are formed on the insulating film 28. And, as shown in FIG. 16, the gold electrodes 23 composing the source electrodes and drain electrodes are formed at the openings 29 and 30. In this way, the field effect power device 15 as shown in FIG. 15 is formed.

As mentioned above, on the top of the sapphire substrate 2, the parallel linear grooves 7 are formed for inducing cracks. These cracks 7 are formed only under the source electrodes 16 and drain electrodes 17 of the field effect power device 15. These grooves 7 are arranged respectively under the respective centers of the source electrodes 16 and the drain electrodes 17. The grooves may be formed slightly shifted from right under the centers, though it is necessary to arrange the grooves at least under the inside of each side edge of the bottoms of the source electrodes and drain electrodes.

The reason of the arrangement is to suppress an occurrence of faults of the field effect power device 15 due to cracks formed upward from the grooves 7 at time of operation. When the cracks 6 are generated sideward shifted from the bottoms of the source electrodes 16 and drain electrodes 17, the cracks 6 reach inside the current paths between the source electrodes and the drain electrodes. And, faults such as interruption of the source-drain current and leakage to the sapphire substrate 2 are caused. Further, in this embodiment, the linear grooves 7 are used, though linear convexes may be used similarly to the first embodiment.

In these embodiments, as a device to be formed, an example of the field effect power device is explained. However, the embodiments can be applied to transistor power devices such as an FET (field effect transistor), an HEMT (high electron mobility transistor), and an HBT (heterojunction bipolar transistor).

Further, it is possible to arrange areas for introducing cracks such as the linear grooves 7 so as to cleave the separation areas between the elements and separate the elements at the crack parts. In this case, except for the above-mentioned transistor device, it is possible to apply to other semiconductor device, such as optical device emitting light by injecting carriers into active layer including laser and LED(light emitting diode).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate for forming a semiconductor layer by crystal growth, comprising:
a plurality of linear convexes or grooves formed along a direction of a cleavage plane of the semiconductor layer on a surface of the substrate and the plurality of linear convexes or grooves are each a continuous straight line throughout a part of the substrate for forming the semiconductor layer on the surface, and a plurality of alignment marks for an exposure device being arranged between two directly adjacent convexes or grooves of the plurality of linear convexes or grooves on the surface, the plurality of alignment marks being arranged in a parallel line with respect to the two directly adjacent convexes or grooves, and the plurality of alignment marks between each of the directly adjacent convexes or grooves, separating the plurality of linear convexes or grooves.

2. The substrate according to claim 1, wherein the substrate is a sapphire substrate or SiC substrate.

3. The substrate according to claim 2, wherein the semiconductor layer is a nitride semiconductor layer.

4. A power device comprising:
a semiconductor substrate comprising a plurality of linear convexes or grooves on a surface of the semiconductor substrate and the plurality of linear convexes or grooves are each a continuous straight line throughout a part of the substrate, and a plurality of alignment marks for an exposure device being arranged between two directly adjacent convexes or grooves of the plurality of linear convexes or grooves on the surface, the plurality of alignment marks being arranged in a parallel line with respect to the two directly adjacent convexes or grooves, and the plurality of alignment marks between each of the directly adjacent convexes or grooves, separating the plurality of linear convexes or grooves; and
a semiconductor layer having a cleavage plane along a direction of the plurality of linear convexes or grooves on the surface.

5. The power device according to claim 4, wherein cracks are generated on the linear convexes or grooves, and a plurality of semiconductor elements formed on the semiconductor substrate are isolated by the cracks, respectively.

6. A power device comprising:
a semiconductor substrate having a plurality of linear convexes or grooves on a surface of the semiconductor substrate and the plurality of linear convexes or grooves are each a continuous straight line throughout a part of the substrate, and a plurality of alignment marks for an exposure device being arranged between two directly adjacent convexes or grooves of the plurality of linear convexes or grooves on the surface, the plurality of alignment marks being arranged in a parallel line with respect to the two directly adjacent convexes or grooves, and the plurality of alignment marks between each of the directly adjacent convexes or grooves, separating the plurality of linear convexes or grooves;
a semiconductor layer having a cleavage plane along a direction of the plurality of linear convexes or grooves on the surface; and
electrodes being arranged above the plurality of linear convexes or grooves.

7. An optical device comprising:
a semiconductor substrate having a plurality of linear convexes or grooves on a surface of the semiconductor substrate and the plurality of linear convexes or grooves are each a continuous straight line throughout a part of the substrate, and a plurality of alignment marks for an exposure device being arranged between two directly adjacent convexes or grooves of the plurality of linear convexes or grooves on the surface, the plurality of alignment marks being arranged in a parallel line with respect to the two directly adjacent convexes or grooves, and the plurality of alignment marks between each of the directly adjacent convexes or grooves, separating the plurality of linear convexes or grooves;

a semiconductor layer having a cleavage plane along a direction of the plurality of linear convexes or grooves on the surface and including an active layer; and an electrode configured to inject a carrier into the active layer.

8. The optical device according to claim 7, wherein the semiconductor substrate is a sapphire substrate or an SiC substrate, and the semiconductor layer is a nitride semiconductor layer.

9. A manufacturing method of a semiconductor device, the method comprising:

forming a plurality of linear convexes or grooves on a surface of a semiconductor substrate and the plurality of linear convexes or grooves are each a continuous straight line throughout a part of the substrate, and a plurality of alignment marks for an exposure device being arranged between two directly adjacent convexes or grooves of the plurality of linear convexes or grooves on the surface, the plurality of alignment marks being arranged in a parallel line with respect to the two directly adjacent convexes or grooves, and the plurality of alignment marks between each of the directly adjacent convexes or grooves, separating the plurality of linear convexes or grooves; and forming a semiconductor layer having a cleavage plane along a direction of the plurality of linear convexes or grooves by epitaxial growth on the surface.

10. The method according to claim 9, further comprising forming cracks on the linear convexes or grooves, and isolating a plurality of semiconductor elements formed on the semiconductor substrate by the cracks, respectively.

* * * * *